(12) United States Patent
Wan et al.

(10) Patent No.: US 11,916,108 B2
(45) Date of Patent: Feb. 27, 2024

(54) SEMICONDUCTOR DEVICES AND METHODS OF FORMING THE SAME

(71) Applicant: MediaTek Inc., Hsin-Chu (TW)

(72) Inventors: Cheng-Tien Wan, Hsin-Chu (TW); Ming-Cheng Lee, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 18/161,181

(22) Filed: Jan. 30, 2023

(65) Prior Publication Data

US 2023/0178607 A1 Jun. 8, 2023

Related U.S. Application Data

(62) Division of application No. 17/513,819, filed on Oct. 28, 2021, now Pat. No. 11,600,700, which is a division of application No. 16/590,053, filed on Oct. 1, 2019, now Pat. No. 11,189,694.

(60) Provisional application No. 62/751,753, filed on Oct. 29, 2018.

(51) Int. Cl.
| | |
|---|---|
| *H01L 21/8238* | (2006.01) |
| *H01L 29/08* | (2006.01) |
| *H01L 27/092* | (2006.01) |
| *H01L 29/06* | (2006.01) |
| *H01L 29/66* | (2006.01) |
| *H01L 29/78* | (2006.01) |

(52) U.S. Cl.
CPC .. *H01L 29/0847* (2013.01); *H01L 21/823814* (2013.01); *H01L 21/823821* (2013.01); *H01L 21/823871* (2013.01); *H01L 27/0924* (2013.01); *H01L 29/0673* (2013.01); *H01L 29/66795* (2013.01); *H01L 29/785* (2013.01)

(58) Field of Classification Search
CPC ............... H01L 21/823814; H01L 29/0847
See application file for complete search history.

(56) References Cited

U.S. PATENT DOCUMENTS

| 9,024,368 B1 | 5/2015 | Yu et al. |
|---|---|---|
| 11,189,694 B2 | 11/2021 | Wan et al. |
| 2010/0270619 A1 | 10/2010 | Lee |
| 2014/0246605 A1 | 11/2014 | Zeitzoff et al. |

(Continued)

FOREIGN PATENT DOCUMENTS

| CN | 107527911 A | 12/2017 |
|---|---|---|
| DE | 102017110440 A1 | 6/2018 |

(Continued)

OTHER PUBLICATIONS

U.S. Appl. No. 16/590,053, filed Oct. 1, 2019, Wan et al.

(Continued)

*Primary Examiner* — Douglas M Menz
(74) *Attorney, Agent, or Firm* — Wolf, Greenfield & Sacks, P.C.

(57) ABSTRACT

A semiconductor device is provided. The semiconductor device includes a semiconductor fin over a substrate, and a gate structure along sidewalls and the top surface of the semiconductor fin. The gate structure covers the first portion of the semiconductor fin. The semiconductor device also includes a source/drain feature adjacent to the gate structure. The semiconductor device further includes a source/drain contact connected to the source/drain feature. The source/drain contact extends downwards to a position that is lower than the top surface of the first portion of the semiconductor fin.

11 Claims, 9 Drawing Sheets

(56) References Cited

U.S. PATENT DOCUMENTS

| | | |
|---|---|---|
| 2016/0190133 A1 | 6/2016 | Wu et al. |
| 2016/0276449 A1 | 9/2016 | Bae et al. |
| 2016/0315081 A1 | 10/2016 | Park et al. |
| 2018/0069001 A1 | 3/2018 | Cheng et al. |
| 2018/0197992 A1 | 7/2018 | Cheng et al. |
| 2018/0240889 A1 | 8/2018 | Chi et al. |
| 2018/0248011 A1 | 8/2018 | Mehandru et al. |
| 2019/0013314 A1 | 1/2019 | Choi et al. |
| 2019/0296144 A1 | 9/2019 | Jung et al. |
| 2020/0135859 A1 | 4/2020 | Wan et al. |
| 2022/0052160 A1 | 2/2022 | Wan et al. |

FOREIGN PATENT DOCUMENTS

| | | |
|---|---|---|
| EP | 19204764.5 | 3/2020 |
| JP | 2003-069013 A | 3/2003 |

OTHER PUBLICATIONS

U.S. Appl. No. 17/513,819, filed Oct. 28, 2021, Wan et al.

Extended European Search Report dated Mar. 17, 2020 in connection with European Application No. 19204764.5.

Dutta et al., Physical Insights Into Electric Field Modulation in Dual-$k$ Spacer Asymmetric Underlap FinFET. IEEE Transactions on Electron Devices. Aug. 2016;63(8):3019-27.

Shin et al., Threshold voltage variation-immune FinFET design with metal-interlayer-semiconductor source/drain structure. Current Applied Physics. Mar. 2016;16(6):618-22.

SEMICONDUCTOR DEVICES AND METHODS OF FORMING THE SAME

CROSS REFERENCE TO RELATED APPLICATIONS

This application is a Division of U.S. application Ser. No. 17/513,819, filed Oct. 28, 2021, entitled "SEMICONDUCTOR DEVICES AND METHODS OF FORMING THE SAME", which is a Division of U.S. application Ser. No. 16/590,053, filed Oct. 1, 2019, entitled "SEMICONDUCTOR DEVICES AND METHODS OF FORMING THE SAME", which claims priority of U.S. Provisional Application No. 62/751,753 filed on Oct. 29, 2018, entitled "CONTACT AND SOURCE/DRAIN SCHEME FOR FINFET, NANOWIRE AND NANO SHEET STRUCTURES," the entirety of each of which is incorporated by reference herein.

BACKGROUND OF THE INVENTION

Field of the Invention

The present invention relates to semiconductor devices and methods of forming the same, and in particular to non-planar semiconductor devices having improved source/drain contacts and methods of forming the same.

Description of the Related Art

In recent years, advanced integrated circuit (IC) devices have been become increasingly multifunctional and have been scaled down in size. Although the scaling down process generally increases production efficiency and lowers associated costs, it has also increased the complexity of processing and manufacturing IC devices.

For example, Fin Field-Effect Transistors (FinFETs) have been introduced to replace planar transistors. Structures of FinFETs and methods of fabricating FinFETs are being developed. In conventional structures of FinFETs, source/drain features epitaxially grown upwardly with a large volume exert a strain in a channel region. When the size of a FinFET is reduced, the complexity of forming high-volume source/drain features is increased. Conventional processes for epitaxially forming high-volume source/drain features require several steps of deposition and etching, which is time-consuming and difficult to control. Also, the strain effect of conventional high-volume source/drain features on the channel resistance (Rch) of a semiconductor device is decreased when the semiconductor device is scaled down. Thus, a novel semiconductor device structure and a forming method thereof are desirable.

BRIEF SUMMARY OF THE INVENTION

Semiconductor devices and methods of forming the same are provided. An exemplary embodiment of a semiconductor device includes a semiconductor fin over a substrate, and a gate structure along sidewalls and the top surface of the semiconductor fin. The gate structure covers a first portion of the semiconductor fin. The semiconductor device also includes a source/drain feature adjacent to the gate structure. The semiconductor device further includes a source/drain contact connected to the source/drain feature. The source/drain contact extends downwards to a position that is lower than the top surface of the first portion of the semiconductor fin.

An exemplary embodiment of a method of forming a semiconductor device includes forming a semiconductor fin over a substrate. A gate structure is formed along sidewalls and the top surface of the first portion of the semiconductor fin. The gate structure exposes a second portion of the semiconductor fin. A dielectric layer is formed on the substrate, and the dielectric layer covers the exposed second portion of the semiconductor fin. A part of the dielectric layer is removed to form a first hole, wherein the first hole exposes the second portion of the semiconductor fin. A part of the second portion of the semiconductor fin is then removed to form a second hole. The first hole connects the second hole. A source/drain feature is formed in the second hole. The source/drain feature defines a recessed region that is lower than the top surface of the first portion of the semiconductor fin. A source/drain contact is formed in the recessed region and the first hole.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It should be understood that when an element is referred to as being "connected" or "contacting" to another element, it may be directly connected or contacting to the other element or intervening elements may be present.

Similarly, it should be understood that when an element such as a layer, region or substrate is referred to as being "on" another element, it can be directly on the other element or intervening elements may be present. In contrast, the term "directly" means that there are no intervening elements. It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. It should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same or similar reference numerals or reference designators denote the same or similar elements throughout the specification.

Figure 1:
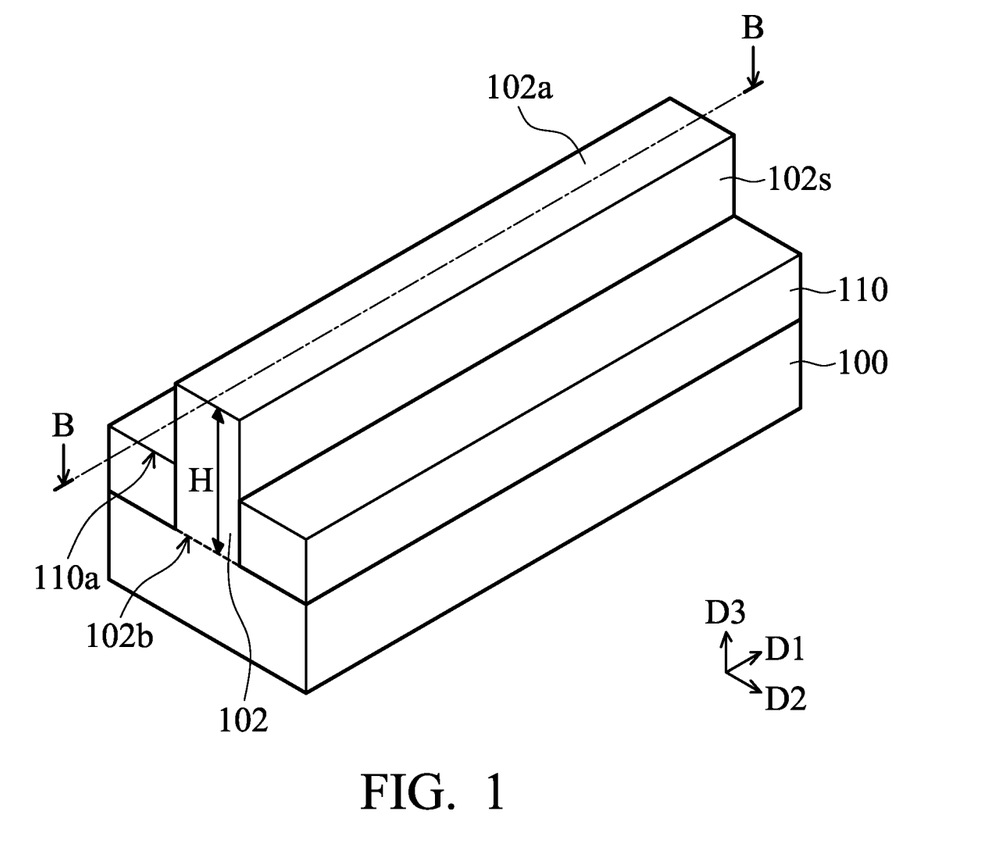
FIG. 1 is a perspective view of a semiconductor fin over a substrate.
Figure 2A:
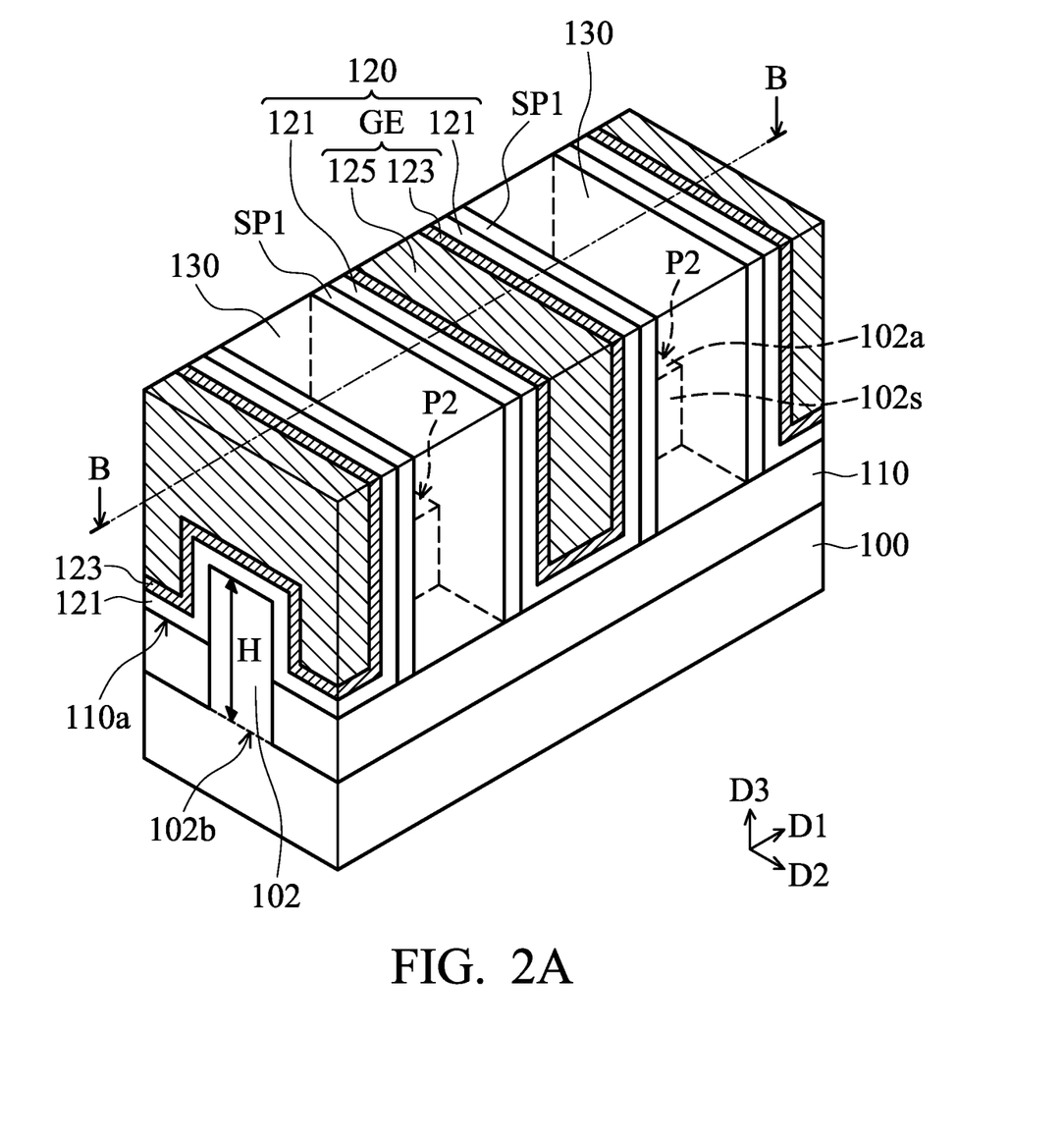
FIG. 2A is a perspective view of an intermediate stage of a semiconductor device, in accordance with some embodiments.
Figure 2B:
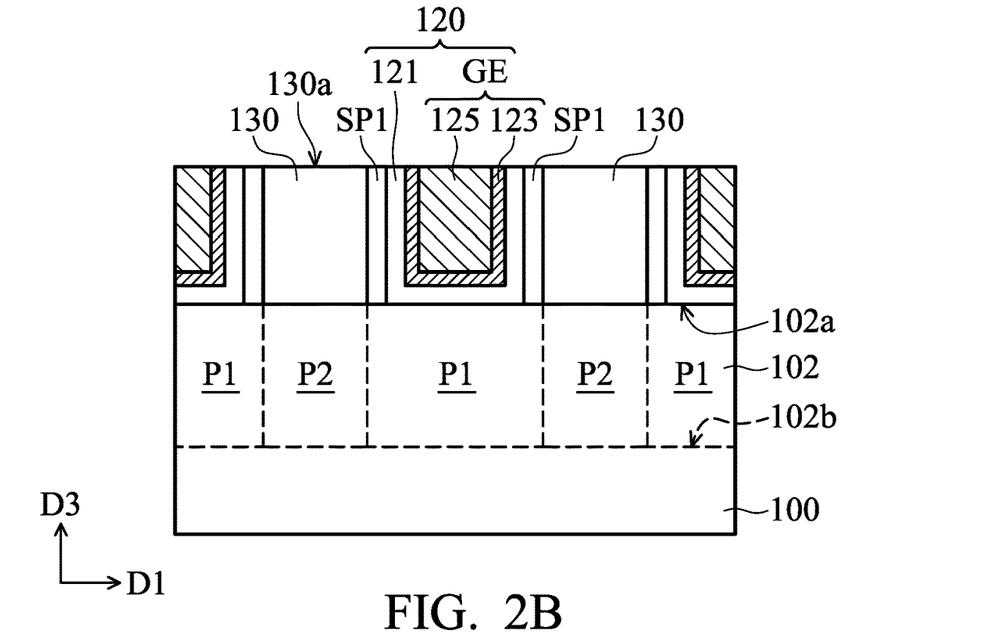
FIG. 2B, FIG. 3, FIG. 4, FIG. 5 and FIG. 6 are cross-sectional views of intermediate stages of a process for forming a semiconductor device, in accordance with some embodiments.

FIG. 1 is a perspective view of a semiconductor fin over a substrate. FIG. 2A is a perspective view of an intermediate stage of a semiconductor device, in accordance with some embodiments. FIG. 2B, FIG. 3 through FIG. 6 are cross-sectional views of intermediate stages of a process for forming a semiconductor device, in accordance with some embodiments. FIG. 2B is a cross-sectional view taken along sectional line B-B of the structure of FIG. 2A. FIG. 3 through FIG. 6 are illustrated along a similar sectional line B-B in FIG. 2. In some embodiments, the semiconductor device is a three-dimensional or non-planar transistor.

Referring to FIG. 1, a substrate 100 is provided, and a semiconductor fin 102 is formed over the substrate 100. An isolation layer 110 is formed over the substrate 100 and disposed adjacent to the semiconductor fin 102. In some embodiments, a plurality of semiconductor fins protrude from the substrate 100. To simplify the diagram, only one semiconductor fin is depicted herein. Also, in some embodiments, the bottom surface 102b of the semiconductor fin 102 can be defined as an interface between the semiconductor fin 102 and the substrate 100. A height H of the semiconductor fin 102 measured from the bottom surface 102b to the top surface 102a is depicted in FIG. 1.

In some embodiments, the substrate 100 is a bulk semiconductor substrate, such as a semiconductor wafer. For example, the substrate 100 includes silicon or other elementary semiconductor materials such as germanium. The substrate 100 may be un-doped or doped (e.g., p-type, n-type, or a combination thereof). In some embodiments, the substrate 100 includes an epitaxially grown semiconductor layer on a dielectric layer. The epitaxially grown semiconductor layer may be made of silicon germanium, silicon, germanium, one or more other suitable materials, or a combination thereof. In some other embodiments, the substrate 100 includes a multi-layered structure. For example, the substrate 100 includes a silicon-germanium layer formed on a bulk silicon layer.

In some embodiments, the semiconductor fin 102 is a fin for forming a FinFET, and may be formed/patterned by any suitable method. For example, fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. In some embodiments, the semiconductor fin 102 may be further patterned into nanowires or nanosheets for gate-all-around field-effect transistor (GAAFET).

In some embodiments, the isolation layer 110 exposes a top portion of the semiconductor fin 102. The isolation layer 110 can also be referred to as isolation features which are used to define and electrically isolate various device elements formed in and/or over the substrate 100. In some embodiments, the isolation layer 110 includes shallow trench isolation (STI) features, local oxidation of silicon (LOCOS) features, other suitable isolation features, or a combination thereof.

In some embodiments, the isolation layer 110 has a multi-layer structure. In some embodiments, the isolation layer 110 is made of a dielectric material. The dielectric material may include silicon oxide, silicon nitride, silicon oxynitride, fluoride-doped silicate glass (FSG), low-K dielectric material, one or more other suitable materials, or a combination thereof.

FIG. 2A is a perspective view of an intermediate stage of a semiconductor device, in accordance with some embodiments. FIG. 2B is a cross-sectional view taken along sectional line B-B of the structure in FIG. 2A. In some embodiments, formations of dummy gates and spacers over a substrate 100 followed by replacement metal gate (RMG) process (not shown) are performed. To illustrate the embodiments clearly, FIG. 2A and FIG. 2B exemplarily depict the gate structures 120 formed after replacement metal gate process. The gate structures 120 may be referred to as metal-gate structures.

In FIG. 2A, several gate structures 120 are formed on the isolation layer 110, and an interlayer dielectric layer 130 fills the spaces between the gate structures 120. In some embodiments, each of the gate structures 120 is formed along sidewalls 102s and the top surface 102a of the semiconductor fin 102. The semiconductor fin 102 may extend in the first direction D1, and each of the gate structures 120 may extend in the second direction D2, as shown in FIG. 2A.

Also, in this exemplified embodiment, the gate structures 120 cover first portions P1 of the semiconductor fin 102 and expose the second portions P2 of the semiconductor fin 102.

In some embodiments, each of the gate structures 120 includes a gate dielectric layer 121 and a gate electrode GE on the gate dielectric layer 121. Also, spacers SP1 are formed on sidewalls of the gate structures 120 for separating the gate structures 120 and source/drain features formed subsequently.

In FIG. 2A and FIG. 2B, the gate dielectric layer 121 surrounds and covers the first portion P1 of the semiconductor fin 102. In some embodiments, the gate dielectric layer 121 is a high-k gate dielectric layer that has a greater dielectric constant than that of silicon dioxide. The gate dielectric layer 121 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K dielectric materials, or a combination thereof. The gate dielectric layer 121 may be deposited using a chemical vapor deposition (CVD) process, an atomic layer deposition (ALD) process, a physical vapor deposition (PVD) process, one or more other applicable processes, or a combination thereof.

In some embodiments, the gate electrode GE includes a work function layer 123 and a metal filling layer 125 deposited over the work function layer 123. As shown in FIG. 2A and FIG. 2B, the work function layer 123 is deposited over the gate dielectric layer 121, in accordance with some embodiments. The work function layer 123 extends into a recess defined by the gate dielectric layer 121. The metal filling layer 125 is deposited over the work function layer 123 to fill the recess.

The work function layer 123 of the gate electrode GE may be used to provide the desired work function for transistors to enhance device performance including improved threshold voltage. In some embodiments, the work function layer 123 for forming an NMOS device includes titanium nitride, tantalum, tantalum nitride, one or more other suitable materials, or a combination thereof. Also, in some other embodiments, the work function layer 123 for forming an NMOS device is an aluminum-containing layer. For example, the aluminum-containing layer includes TiAlC, TiAlO, TiAlN, one or more other suitable materials, or a combination thereof. In some embodiments, the work function layer 123 for forming a PMOS device may include metal, metal carbide, metal nitride, other suitable materials, or a combination thereof. For example, the work function layer 123 for forming a PMOS device includes tantalum nitride, tungsten nitride, titanium, titanium nitride, other suitable materials, or a combination thereof. The work function layer 123 may be deposited using an ALD process, a CVD process, a PVD process, an electroplating process, an electroless plating process, one or more other applicable processes, or a combination thereof.

In some embodiments, the metal filling layer 125 of the gate electrode GE surrounds the semiconductor fin 102. The metal filling layer 125 may be made of or include tungsten, aluminum, copper, cobalt, one or more other suitable materials, or a combination thereof. The metal filling layer 125 may be deposited using an ALD process, a PVD process, a CVD process, an electroplating process, an electroless plating process, one or more other applicable processes, or a combination thereof.

In some embodiments, an interlayer dielectric layer 130 formed on the substrate 20 fills spaces between adjacent gate structures 120 and covers the second portions P2 of the semiconductor fin 102, as shown in FIG. 2A and FIG. 2B. According to the present disclosure, it is noted that source/drain features are formed after the replacement metal gate process. Therefore, the interlayer dielectric layer 130 in FIG. 2A and FIG. 2B covers the second portions P2 of the semiconductor fin 102, and does not cover any source/drain feature which has not been formed.

One example for fabricating the structural configuration of FIG. 2A and FIG. 2B is described below. After dummy gate stacks (not shown) are formed above the substrate 10, a dielectric material is deposited over the substrate 10, and may be deposited by any suitable method, such as CVD, plasma-enhanced CVD (PECVD), or FCVD. In some embodiments, the dielectric material may include silicon nitride, silicon oxide, silicon oxynitride, or the like. In some embodiments, the dielectric material may include phospho-silicate glass (PSG), boro-silicate glass (BSG), boron-doped phospho-silicate glass (BPSG), undoped silicate glass (USG), or the like. Then, a planarization process, such as a CMP, is performed to level the top surface of the dielectric material with top surfaces of dummy gates (not shown) or masks (not shown) of the dummy gate stacks. Afterwards, the dummy gates (and the masks if present) are removed in an etching step(s), so that recesses (not shown) for receiving materials of the gate structures 120 are formed. After depositions of materials of the gate structures 120, a planarization process, such as a CMP, is performed to remove the excess portions of the materials of the gate structures 120 over the top surface of the dielectric material. Thus, the structure (including the interlayer dielectric layer 130 and the gate structure 120) as shown in FIG. 2A and FIG. 2B is formed. Accordingly, the interlayer dielectric layer 130 in FIG. 2A and FIG. 2B exposes top surfaces of the gate structures 120, and the top surface 130a of the interlayer dielectric layer 130 is level with the top surfaces of the gate structures 120. Also, the remaining portions of materials of the gate structures 120 (e.g. including the gate dielectric layer 121 and the gate electrode GE) form replacement gates of resulting devices.

After forming the gate structures 120 by a suitable replacement gate process, steps of forming holes for forming source/drain features and source/drain contacts are performed, in accordance with some embodiments of the disclosure.

Figure 3:
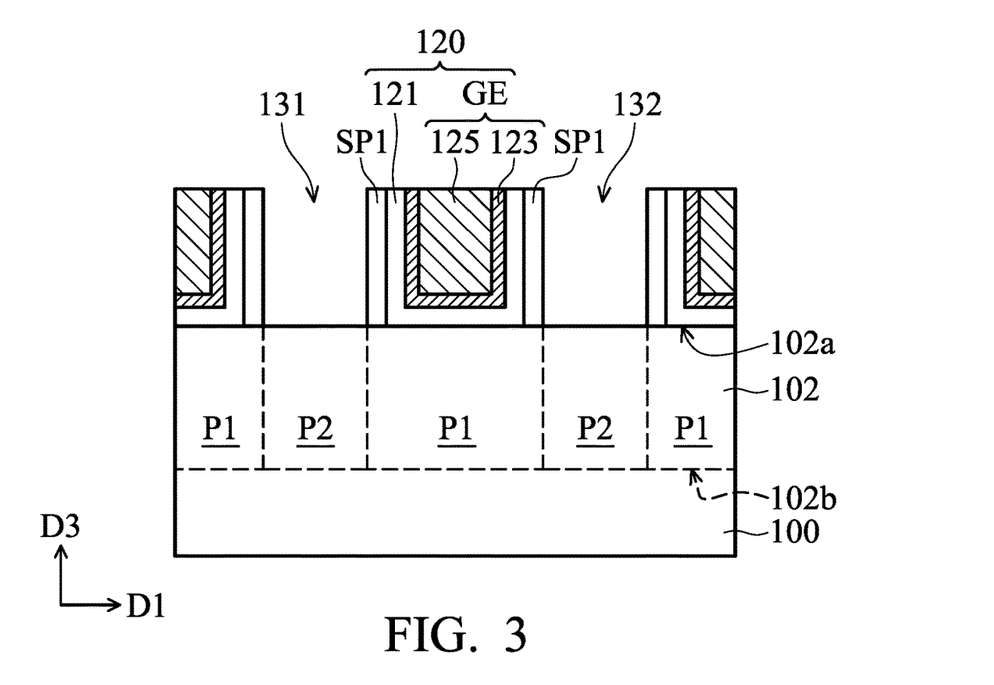

Referring to FIG. 3, parts of the interlayer dielectric layer 130 are removed to form first holes 131 and 132. The first holes 131 and 132 in the interlayer dielectric layer 130 may be formed using acceptable photolithography and etching techniques. The first holes 131 and 132 are formed between adjacent gate structures 120 and are defined along opposite spacers SP1 on sidewalls of the gate structures 120. In some embodiments, the first holes 131 and 132 expose the second portions P2 of the semiconductor fin 102 on opposite sides of the gate structures 120.

Afterwards, the exposed second portions P2 of the semiconductor fin 102 are recessed to define regions for forming source/drain features and receiving lower portions of source/drain contacts in subsequent processes.

Figure 4:
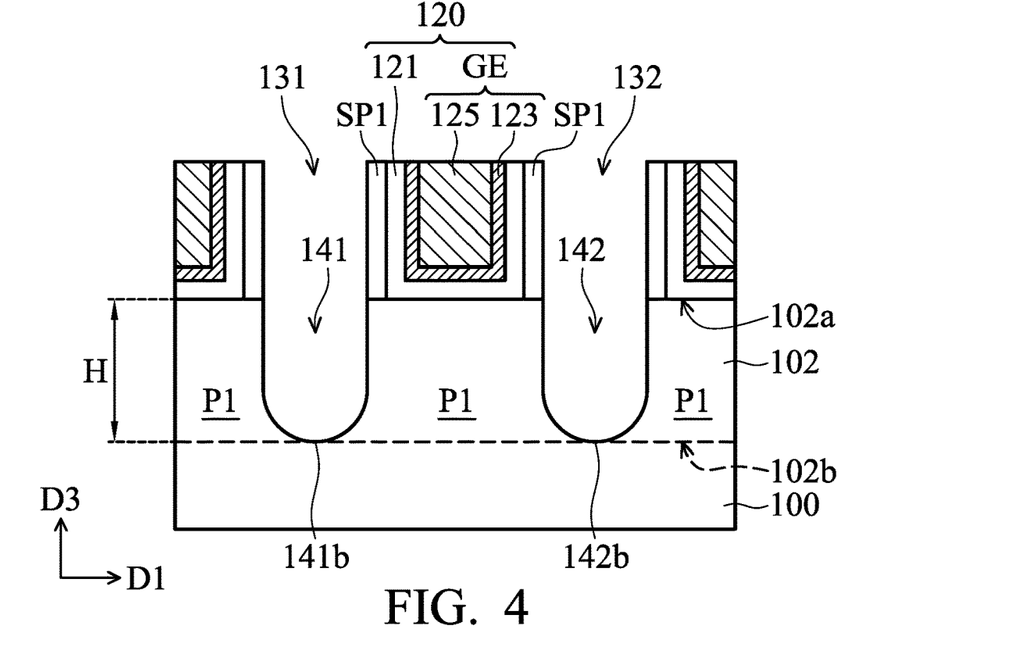

Referring to FIG. 4, the second portions P2 of the semiconductor fin 102 are recessed to form second holes 141 and 142. The second holes 141 and 142 are formed on opposite sides of the gate structure 120 and below the first holes 131 and 132. The second holes 141 and 142 may be formed by etching the second portions P2 of the semiconductor fin 102 along the first holes 131 and 132 without further masking process. In some embodiments of the present disclosure, an etching step for forming the first holes 131 and 132 and an etching step for forming the second holes 141 and 142 are performed in-situ in the same etching chamber using suitable etchants. The deeper the first recess 141 and the second recess 142, the lower the bottom surfaces of source/drain contacts formed in subsequent processes.

In some embodiments, at least parts of the second portions P2 of the semiconductor fin 102 are removed for forming the second holes 141 and 142. It is noted that FIG. 4 depicts the sidewalls of the second holes 141 and 142 substantially aligned with the sidewalls of the first holes 131 and 132, but the present disclosure is not limited thereto. In some embodiments, the second holes 141 and 142 are formed by anisotropic etching or isotropic etching to enlarge the dimensions of the second holes 141 and 142. Also, the bottom surface 141b of the second hole 141 and the bottom surface 142b of the second hole 142 are lower than the top surface 102a of the first portion P1 of the semiconductor fin 102. In some embodiments, the bottom surfaces 141b and 142b reach the bottom surface 102b of the semiconductor fin 102, as shown in FIG. 4. However, the present disclosure is not limited thereto. The bottom surface 141b and 142b of the second holes 141 and 142 may be positioned above or lower than the bottom surface 102b of the semiconductor fin 102.

Figure 5:
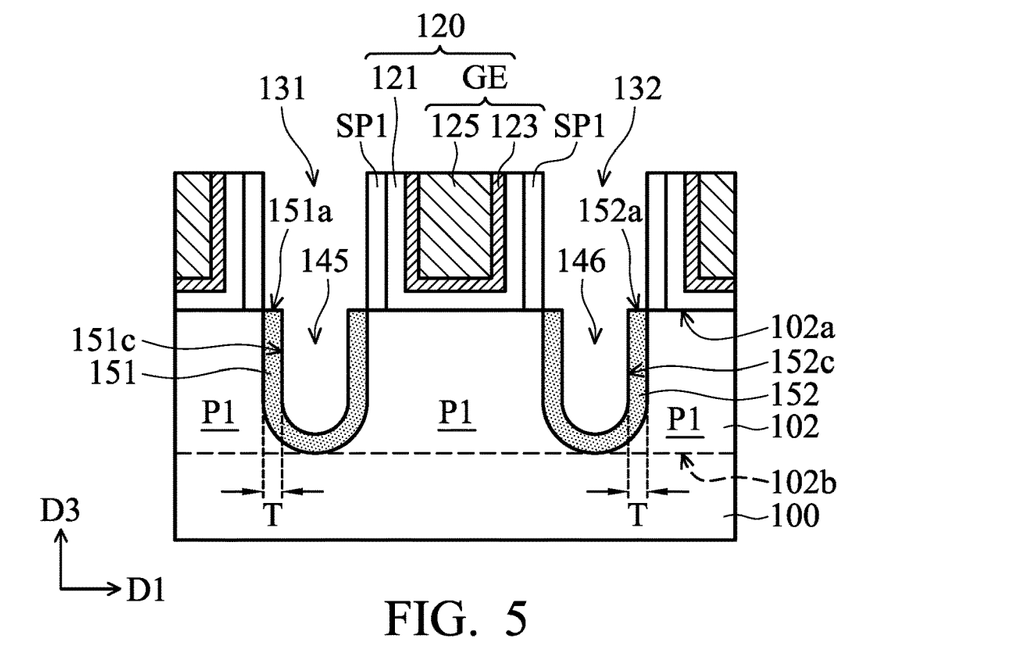

Referring to FIG. 5, the source/drain features 151 and 152 are formed in the second holes 141 and 142, respectively. The source/drain features 151 and 152 can also respectively be referred to as a source region and a drain region of a semiconductor device. The source/drain features 151 and 152 may be formed by epitaxial growth, implantation, or any suitable method. In some embodiments, the source/drain features 151 and 152 are doped regions. For example, the source/drain features 151 and 152 are regions that are heavily doped with impurities. The source/drain features 151 and 152 may have n-type and/or p-type impurities in a concentration of about $10^{19}$ cm$^{-3}$ and about $10^{21}$ cm$^{-3}$. In some embodiments, the source/drain features 151 and 152 may include any acceptable material for forming the required conductive type of semiconductor device in application. For example, the source/drain features 151 and 152 of NMOS devices (e.g. n-type FinFETs) may include SiC, SiCP, SiP, or the like. The source/drain features 151 and 152 of PMOS devices (e.g. p-type FinFETs) may include SiGe, SiGeB, Ge, GeSn, or the like.

Also, the effects of strain that a conventional high-volume source/drain feature puts on a channel region significantly decrease with the reduction of the pitch of the gate structure 120. Thus, contact resistance becomes one of the most important factors for decreasing the resistance of the semiconductor device. Unlike conventional high-volume source/drain features that are epitaxially grown upwardly, the source/drain features 151 and 152 of some embodiments are thin layers that are respectively formed within the second holes 141 and 142 under the top surface 102a of the semiconductor fin 102. Although the source/drain features of the embodiments configured as thin layers cannot exert a strain in a channel region under the gate structure 120, it would be easier and faster for current to pass through source/drain contacts and the thin source/drain features 151 and 152. Therefore, the contact resistance decreases and the electrical performance improves.

In some embodiments, the thickness T of the source/drain feature 151/152 is in a range from about 1 nm to about 10 nm. In some embodiments, the thickness T of the source/drain feature 151/152 is in a range from about 2 nm to about 5 nm. The thickness of the source/drain feature 151 may be substantially equal to the thickness of the source/drain feature 152.

Moreover, each of the source/drain features 151 and 152 has a substantially uniform thickness, in accordance with some embodiments. In some embodiments, each of the source/drain features 151 and 152 has a substantially uniform thickness, such as the uniform thickness T illustrated in FIG. 5. The term "uniform" used herein refers to a variations in thickness of the source/drain feature 151/152 is within +/−10% of the thickness value. The uniform thicknesses of the source/drain features 151 and 152 improve the speed of current flow through the source/drain features 151 and 152.

In FIG. 5, the source/drain feature 151 defines a recessed region 145 lower than the top surface 102a of the first portion P1 of the semiconductor fin 102. Similarly, the source/drain feature 152 defines a recessed region 146 lower than the top surface 102a of the first portion P1 of the semiconductor fin 102. In some embodiments, each of the source/drain features 151 and 152 has a concave cross-sectional shape. For example, the source/drain feature 151 may be configured as a first liner in the second hole 141, and the source/drain feature 152 may be configured as a second liner in the second hole 142, as shown in FIG. 5. Thus, in some embodiments, the source/drain features 151 and 152 may have U-shaped cross sections.

In some embodiments, the top surface of the source/drain feature 151 includes an uppermost surface 151a and a concaved upper surface 151c connected to the uppermost surface 151a, as shown in FIG. 5. The uppermost surface 151a of the source/drain feature 151 may be level with the top surface 102a of the first portion P1 of the semiconductor fin 102. Similarly, the top surface of the source/drain feature 152 includes an uppermost surface 152a and a concaved upper surface 152c connected to the uppermost surface 152a. The uppermost surface 152a of the source/drain feature 152 may be level with the top surface 102a of the first portion P1 of the semiconductor fin 102.

Figure 6:
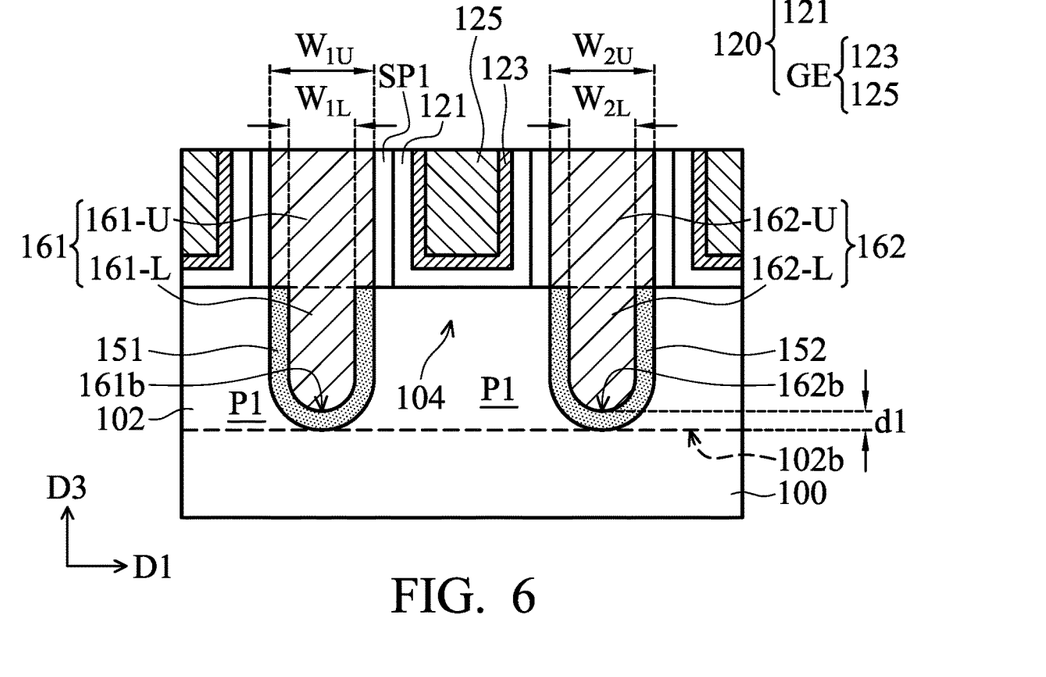

Referring to FIG. 6, after the source/drain features 151 and 152 are formed within the second holes 141 and 142, source/drain contacts 161 and 162 are formed in the recessed regions 145 and 146 and the first holes 131 and 132 to physically and electrically connect the source/drain features 151 and 152, respectively. The source/drain contact 161/162 extending to a position under the top surface of the semiconductor fin 102 facilitate electric current flowing through a channel region between the source/drain features 151 and 152.

Still referring to FIG. 6, a conductive material is deposited in the recessed regions 145, 146 and the first holes 131, 132, so as to form the source/drain contacts 161 and 162, in accordance with some embodiments. According to the embodiments, the source/drain contact 161/162 positioned on opposite sides of the gate structure 120 extends downwards to a position that is lower than the top surface 102a of the first portion P1 of the semiconductor fin 102. Therefore, a lowermost bottom 161b/162b of the source/drain contact 161/162 is lower than the top surface 102a of the first portion P1 of the semiconductor fin 102, As shown in FIG. 6, a portion of the source/drain contact 161/162, which is lower than the top surface of the first portion of the semiconductor fin, is surrounded by the source/drain feature 151/152.

In some other embodiments, the source/drain contact 161/162 includes a liner and a conductive material formed in the recessed region 145/146 and the first hole 131/132. The liner, such as a diffusion barrier layer, may include tantalum, tantalum nitride, titanium, titanium nitride, or the like. The conductive material may be tungsten, copper, a copper alloy, cobalt, aluminum, nickel, or the like. A planarization process, such as a CMP, is performed to remove excess material(s) over the top surface of the interlayer dielectric layer 130. The remaining conductive material and liner (if present) form the source/drain contact 161/162 in the recessed regions 145/146 and the first hole 131/132. An anneal process may be performed to form a silicide at the interface between the source/drain feature 151/152 and the source/drain contact 161/162.

According to the embodiments, the lowermost bottom 161b/162b of the source/drain contact 161/162 is close to the bottom surface 102b of the semiconductor fin 102, which facilitates electric current flowing through a channel region between the source/drain features 151 and 152. In some embodiments, the distance d1 between the lowermost bottom 161b/162b of the source/drain contact 161/162 and the bottom surface 102b of the semiconductor fin 102 is equal to or less than 10 nm.

According to some embodiments, the source/drain contact 161/162 includes two portions respectively lower and higher than the top surface 102a of the first portion P1 of the semiconductor fin 102. As shown in FIG. 6, the source/drain contact 161/162 includes a portion in the recessed region 145/146 and the other portion above the recessed region 145/146. The two portions of the source/drain contact 161/162 are physically and electrically connected to each other.

In FIG. 6, the source/drain contact 161/162 includes a lower portion 161-L/162-L in the recessed region 145/146 and an upper portion 161-U/162-U in the first hole 131/132. The upper portion 161-U/162-U above the recessed region 145/146 is positioned on and electrically connected to the lower portion 161-L/162-L. In some embodiments, the source/drain feature 151/152 surrounds the lower portion 161-L/162-L. For example, the source/drain feature 151/152 wraps around the lower portion 161-L/162-L of the source/drain contact 161/162. As shown in FIG. 6, the lower portion 161-L/162-L is directly formed on the concave upper surface 151c/152c of the source/drain feature 151/152. In some embodiments, the source/drain contacts 162 and 161 are simultaneously formed in the same process.

Also, the lower portion 161-L/162-L and the upper portion 161-U/162-U of the source/drain contact 161/162 may include the same or different conductive materials. In some embodiments, the lower portion 161-L/162-L and the upper portion 161-U/162-U include the same conductive material. Also, process for forming the lower portion 161-L/162-L and the upper portion 161-U/162-U of the source/drain contact 161/162 is not particularly limited. For example, the lower portion 161-L/162-L and the upper portion 161-U/162-U may be formed by one metal-filling step or different metal-filling steps.

Additionally, in this exemplified embodiment, the top surface of the lower portion of the source/drain contact is smaller than the bottom surface of the upper portion of the source/drain contact. For example, the width $W_{1L}$ of the lower portion 161-L of the source/drain contact 161 is smaller than the width $W_{1U}$ of the upper portion 161-U of the source/drain contact 161, as shown in FIG. 6. The width $W_{2L}$ of the lower portion 162-L of the source/drain contact 162 is smaller than the width $W_{2U}$ of the upper portion 162-U of the source/drain contact 162, as shown in FIG. 6.

The semiconductor device in accordance with some embodiments has several advantages. For advanced semiconductor technology, the semiconductor device with smaller fin pitch and taller fin height is fabricated to improve performance and shrink area of the device. Conventional process for epitaxially forming high-volume source/drain features includes several steps of deposition and etching, which is time-consuming and difficult to control. According to the embodiments of the disclosure, it is simple and easy to form the source/drain features 151 and 152 as thin layers in the second holes 141 and 142. Also, it is easier and faster for electric current to pass through the thin layers of the source/drain features, thus decreasing the contact resistance. Additionally, the source/drain feature 151/152 surrounds and fully covers the lower portion of the source/drain contact 161/162, so that a contact area between the source/drain contact 161/162 and the source/drain feature 151/152 is increased and the contact resistance is decreased. Moreover, the source/drain contacts 161 and 162 extending downwards to a position under the top surface of the semiconductor fin 102 facilitate electric current flowing through a channel region between the source/drain features 151 and 152. For example, compared to conventional high-volume source/drain features above top surfaces of fins, the structural configuration of the embodiment leads to electric current flowing between the lowermost bottom 161b of the source/drain contact 161 and the lowermost bottom 162b of the source/drain contact 162, in accordance with the embodiments. That is, electric currents tend to flow through the bottom of the semiconductor fin 102. Thus, configuration of source/drain features and source/drain contacts of a semiconductor device in accordance with some embodiments not only significantly decreases the contact resistance of device but also increase bottom usage of the semiconductor fin. According to the embodiment, electrical performance of a semiconductor device, especially a semiconductor device with small gate length (such as a 7-nm, 5-nm or 3-nm gate length transistor), can be improved.

Although FIG. 6 depicts a cross-sectional view of a semiconductor device, in accordance with some embodiments, the present disclosure is not limited thereto. Configurations of source/drain contacts may be slightly changed or varied according to the methods for forming the source/drain contacts.

FIG. 7 through FIG. 10 are cross-sectional views of intermediate stages of a process for forming a semiconductor device, in accordance with some embodiments. This embodiment is similar to the previous embodiment of FIG. 3 through FIG. 6 except that in this embodiment, an additional dielectric spacer is disposed between the upper portions of the source/drain contacts and the spacers SP1 on sidewalls of the gate structures 120. Accordingly, the upper portions of the source/drain contacts 161' and 162' on opposite sides of the gate structure 120 are farther away from each other to prevent undesirable electrical interference between adjacent source/drain contacts 161' and 162'. This embodiment is suitable for being applied to a semiconductor device with a small gate length, such as a 7-nm, 5-nm or 3-nm gate length transistor. Details regarding this embodiment that are similar to those for the previously described embodiment will not be repeated herein.

Figure 7:
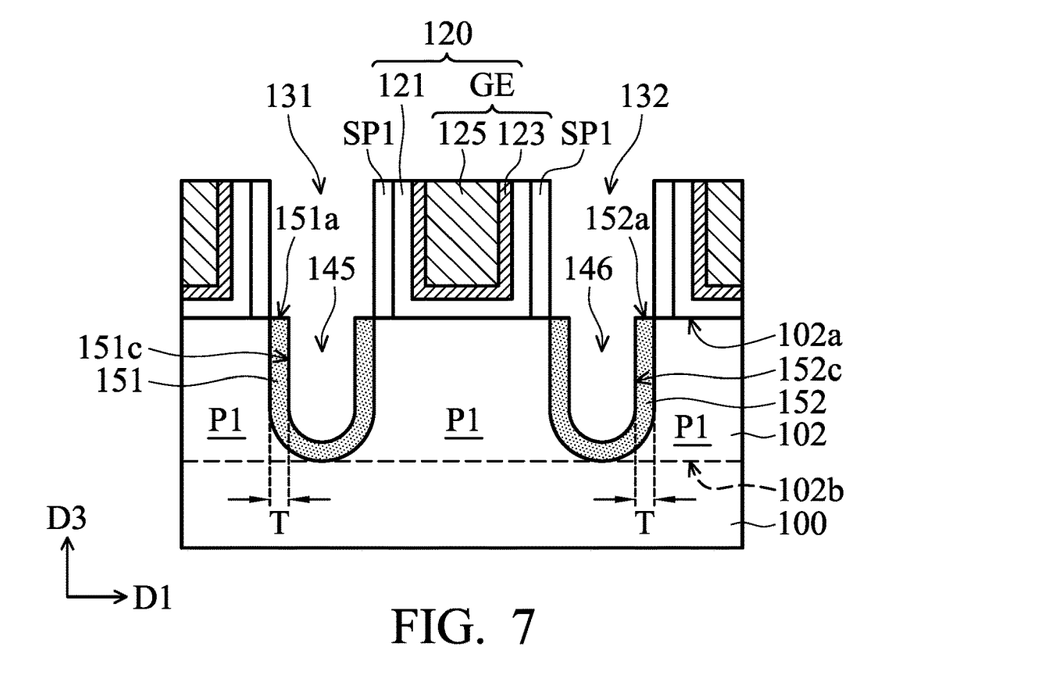
FIG. 7, FIG. 8, FIG. 9 and FIG. 10 are cross-sectional views of intermediate stages of a process for forming a semiconductor device, in accordance with some embodiments.

FIG. 7 is an equivalent intermediate stage of processing as FIG. 5 and the descriptions are not repeated herein.

Figure 8:
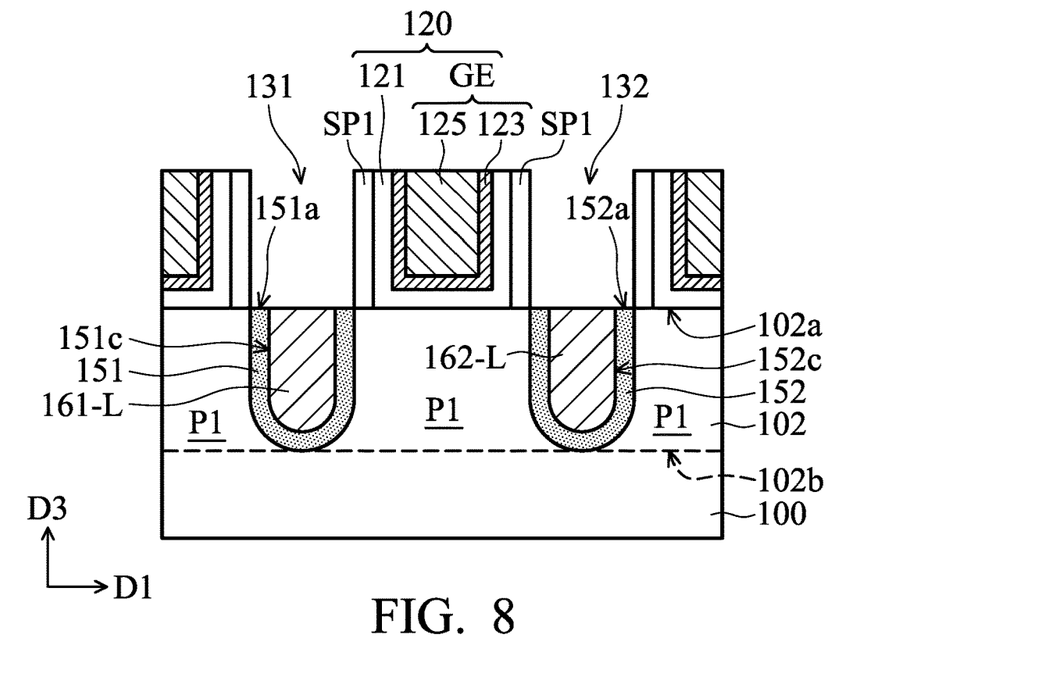

In FIG. 8, a conductive material is deposited in the recessed regions 145 and 146 to form lower portions 161-L and 162-L of source/drain contacts.

Figure 9:
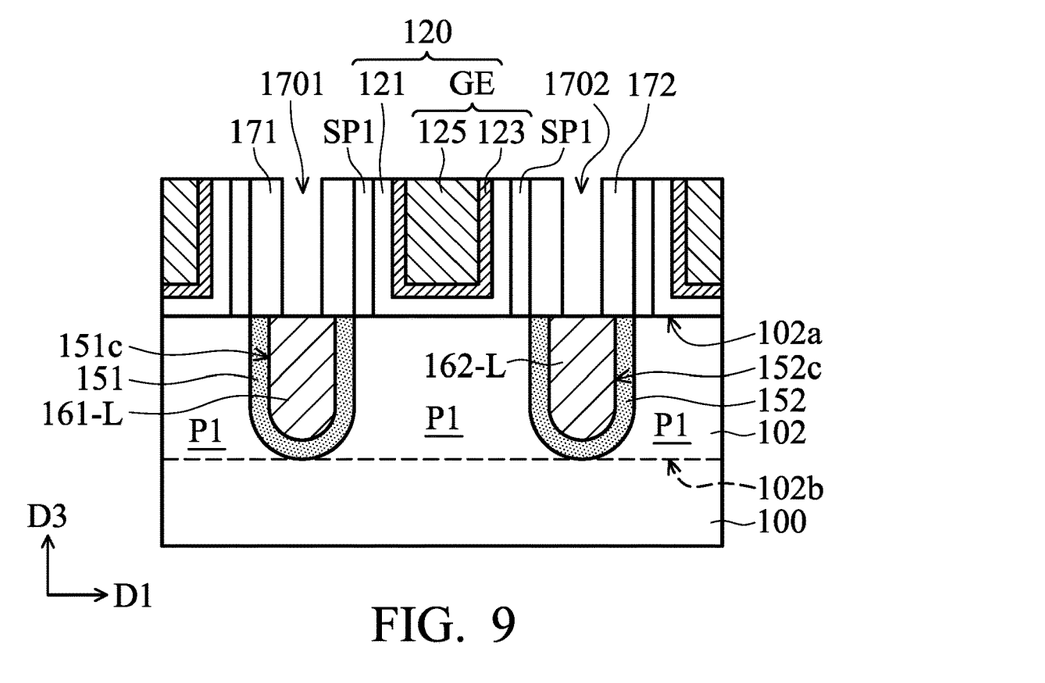

In FIG. 9, additional dielectric spacers 171 and 172 are formed on the sidewalls of the spacers SP1. In some embodiments, an additional dielectric layer is conformably deposited on the gate structures 120 and along the sidewalls of the first holes 131 and 132. In some embodiments, the dielectric layer includes a low-k dielectric material, such as SiCN, SiOCN, SiOC, or the like. The dielectric material layer may be deposited by ALD, CVD, the like, or a combination thereof. Then, the excess material of the dielectric layer over the top surface of gate structures 120 is removed by etch-back process. Thus, the dielectric spacers 171 and 172 are formed on the upper portions 161-U and 162-U, respectively. As shown in FIG. 9, openings 1701 and 1702 are defined between the dielectric spacers 171 and 172. The openings 1701 and 1702 expose parts of the top surfaces of the lower portions 161-L and 162-L, respectively. Also, remained dielectric spacers 171 and 172 cover other parts of the top surfaces of the lower portions 161-L and 162-L, respectively.

Alternatively, the openings 1701 and 1702 can be formed by other suitable processes. For example, for a semiconductor device with small gate length (such as a gate length of a transistor smaller than 5-nm or 3-nm), a dielectric layer deposited on the gate structures 120 may fill up the first holes 131 and 132. A planarization process (such as a CMP process) is performed to remove the excess portion of the dielectric layer on the top surfaces of the gate structures 120. Then, the dielectric material in the first hole 131/132 is partially removed to form the opening 1701/1702 using acceptable photolithography and etching techniques. The remained dielectric material in the first hole 131/132 forms the dielectric spacer 171/172.

Figure 10:
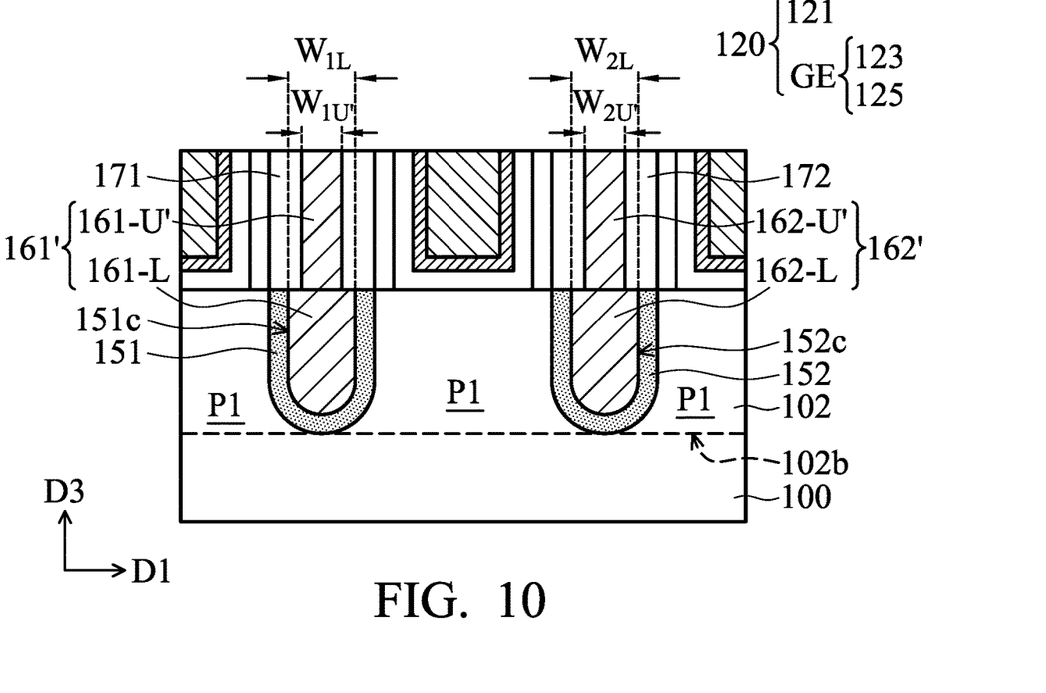

In FIG. 10, upper portions 161-U' and 162-U' of source/drain contacts are formed in the openings 1701 and 1702. For example, a conductive material is deposited on the dielectric spacers 171 and 172 and fills the openings 1701 and 1702. Then, a planarization process, such as a CMP, is performed to remove excess portions of the conductive material over the top surfaces of the dielectric spacers 171 and 172. The upper portion 161-U' and the lower portion 161-L are collectively referred to as a source/drain feature 161'. The upper portion 162-U' and the lower portion 162-L are collectively referred to as a source/drain feature 162'. It is noted that structure and material(s) of the source/drain contact 161'/162' in FIG. 9 are similar to that of the source/drain contact 161/162 for the previously described embodiments and the descriptions will not be redundantly repeated herein.

Moreover, in this exemplified embodiment, the top surface area of the lower portion of the source/drain contact is larger than the bottom surface area of the upper portion of the source/drain contact. For example, the width $W_{1U'}$ the upper portion 161-U' of the source/drain contact 161' is smaller than the width $W_{1L}$ of the lower portion 161-L of the source/drain contact 161', as shown in FIG. 10. The width $W_{2U'}$ of the upper portion 162-U' of the source/drain contact 162' is smaller than the width $W_{2L}$ of the lower portion 162-L of the source/drain contact 162', as shown in FIG. 10. Therefore, the upper portion 161-U' and 162-U' of the source/drain contact 161' and 162' are separated by the gate structure 120, the spacers SP1 and the dielectric spacers 171 and 172, thereby reducing undesired interference between the upper portion 161-U' and 162-U' of the source/drain contact 161' and 162'. In this exemplified embodiment, the structure as shown in FIG. 10 provides several advantages such as the decreasing of contact resistance, simple steps of fabrication and the increasing of bottom usage of semiconductor fins (e.g. fins), which are similar to that of previously described embodiment. It also prevents undesirable electrical interference between adjacent source/drain contacts.

Furthermore, many variations and/or modification can be made to embodiments of the disclosure. In some embodiments, the semiconductor fins 102 over the substrate 100 include nanosheets or nanowires for GAAFET.

Figure 11A:
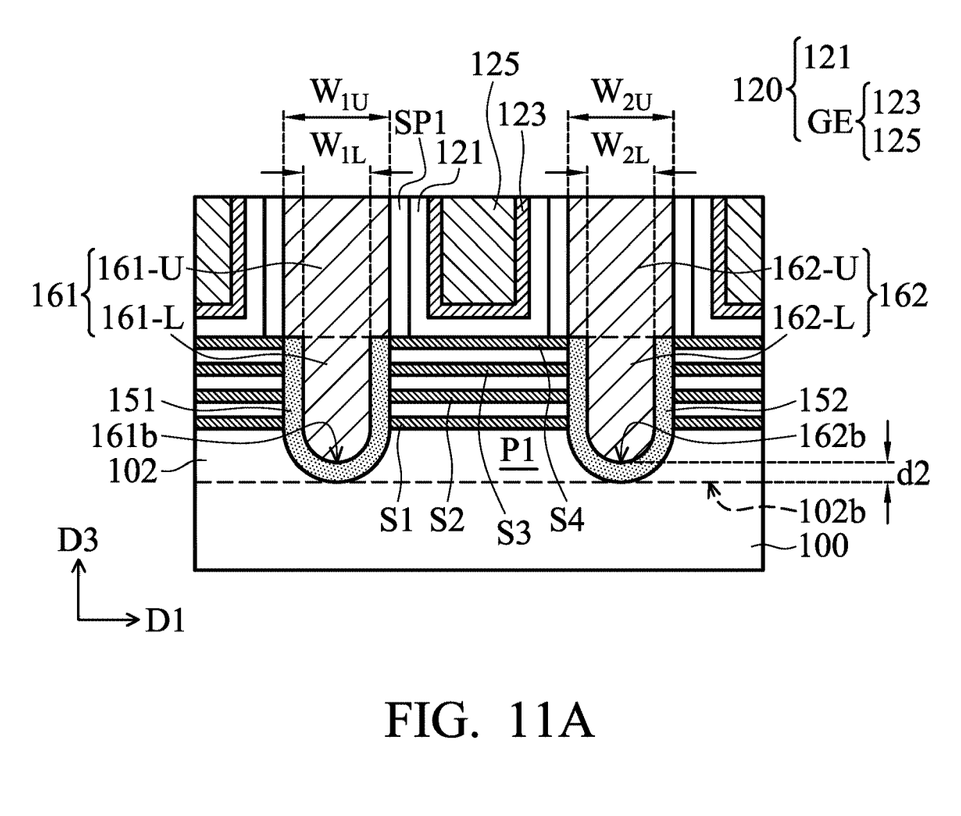
FIG. 11A is a cross-sectional view of a semiconductor device, in accordance with some embodiments.
Figure 11B:
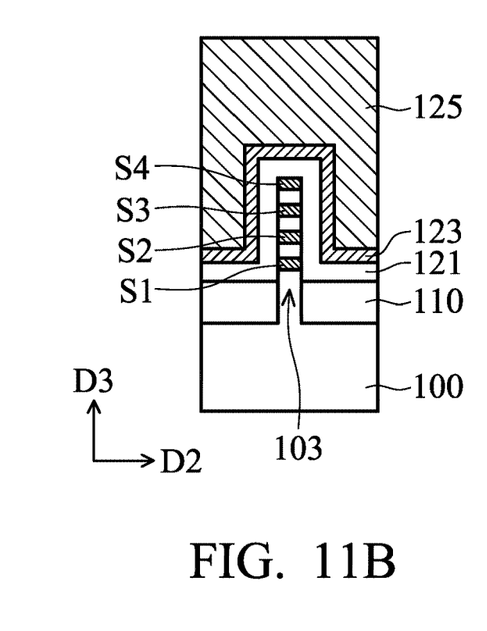
FIG. 11B is a cross-sectional view of a semiconductor device, in accordance with some embodiments.

According to some embodiment of the disclosure, the semiconductor fin of the semiconductor device may include nanosheets. FIG. 11A is a cross-sectional view of a semiconductor device, in accordance with some embodiments. FIG. 11A is illustrated along a similar sectional line B-B in FIG. 2. FIG. 11B is a cross-sectional view of a semiconductor device, in accordance with some embodiments. FIG. 11B is illustrated along a similar sectional line passing the gate structure 120 of FIG. 2A in the second direction D2. Difference between the semiconductor device of FIG. 11A/FIG. 11B and the semiconductor device of FIG. 6 is the semiconductor fin 103 of FIG. 11A/FIG. 11B containing nanosheets. It is noted that details of other components regarding this embodiment that are similar to those for the previously described embodiment, and the descriptions will not be redundantly repeated herein.

In FIG. 11A and FIG. 11B, the semiconductor fin 103 extends along the first direction D1, and each of the gate structures 120 extends along the second direction D2. In some embodiments, the semiconductor fin 103 includes horizontally stacked nanosheets S1, S2, S3 and S4. The nanosheets S1, S2, S3 and S4 are spaced apart from each other in the third direction D3. Also, the gate structure 120 surrounds the nanosheets S1, S2, S3 and S4 of the semiconductor fin 103 from all sides of the nanosheets, which improves the on-off behavior and reduces operational voltage of the semiconductor device. In some embodiments, the source/drain features 151 and 152 configured as thin layers are in direct contact with the nanosheets S1, S2, S3 and S4. The lower portion 161-L/162-L of the source/drain contact 161/162 is surrounded by the source/drain feature 151/152 formed as thin layers.

In some embodiments, structure as shown in FIG. 11A and FIG. 11B provides several advantages similar to that of previously described embodiment. For example, the source/drain contacts 161 and 162 extending downwards to a position under the top surface of the semiconductor fin 103 facilitate electric current flowing through a channel region between the source/drain features 151 and 152. Also, it would be easier and faster for electric current to pass through the source/drain contacts 161 and 162 and thin layers of the source/drain features 151 and 152, thereby decreasing the contact resistance.

Figure 12A:
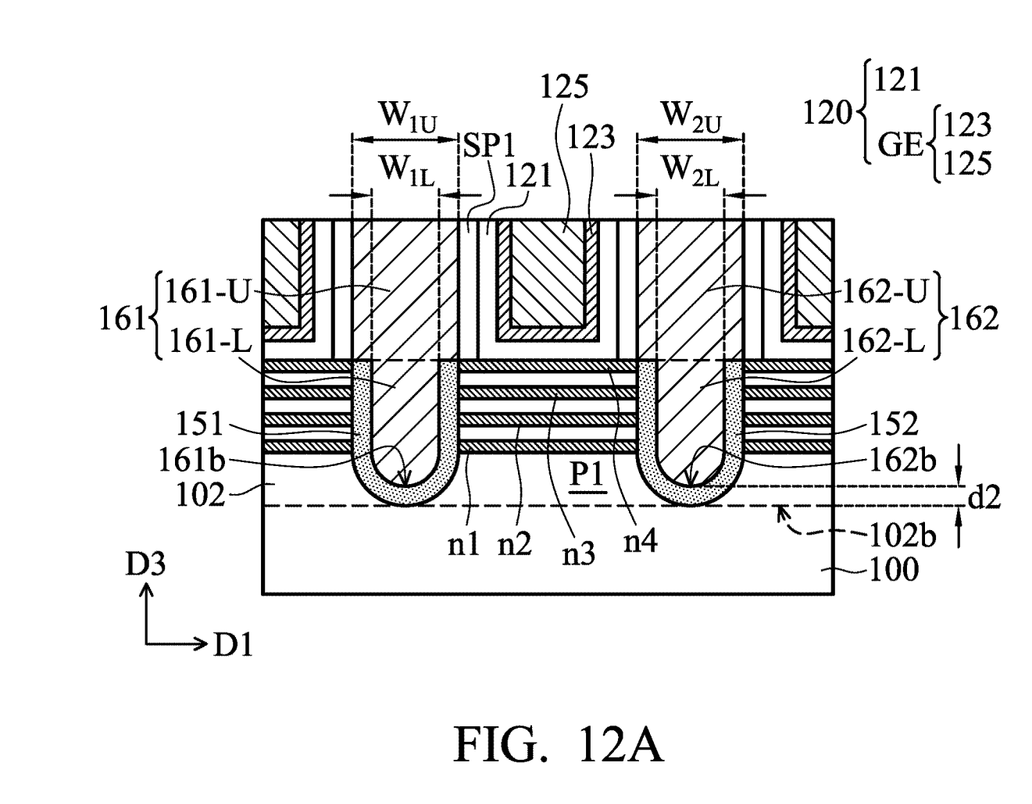
FIG. 12A is a cross-sectional view of a semiconductor device, in accordance with some embodiments.
Figure 12B:
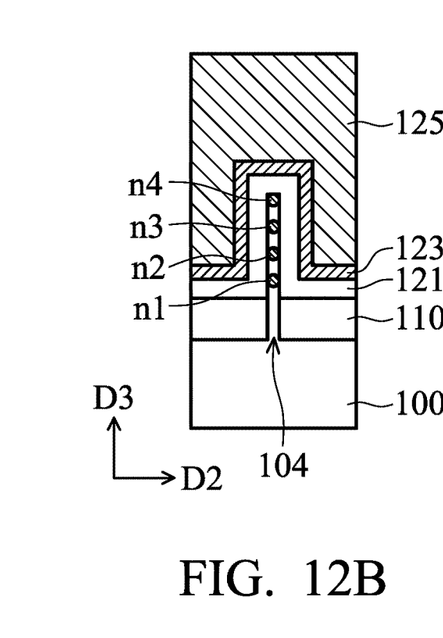
FIG. 12B is a cross-sectional view of a semiconductor device, in accordance with some embodiments.

In addition, the semiconductor fin of the semiconductor device may include nanowires. FIG. 12A is a cross-sectional view of a semiconductor device, in accordance with some embodiments. FIG. 12A is illustrated along a similar sectional line B-B in FIG. 2. FIG. 12B is a cross-sectional view of a semiconductor device, in accordance with some embodiments. FIG. 12B is illustrated along a similar sectional line passing the gate structure 120 of FIG. 2A in the second direction D2. Difference between the semiconductor device of FIG. 12A/FIG. 12B and the semiconductor device of FIG. 6 is the semiconductor fin 104 of FIG. 12A/FIG. 12B containing nanowires. Details of other components regarding this embodiment that are similar to those for the previously described embodiment will not be repeated herein.

In FIG. 12A and FIG. 12B, the semiconductor fin 104 extends along the first direction D1, and each of the gate structures 120 extends along the second direction D2. In some embodiments, the semiconductor fin 104 includes nanowires n1, n2, n3 and n4. The nanowires n1, n2, n3 and n4 are vertically stacked and spaced apart from each other in the third direction D3. Also, the gate structure 120 surrounds the nanowires n1, n2, n3 and n4 of the semiconductor fin 103 from all sides of the nanowires, which improves the on-off behavior and reduces operational voltage of the semiconductor device. In some embodiments, the source/drain features 151 and 152 configured as thin layers are in direct contact with the nanowires n1, n2, n3 and n4. The lower portion 161-L/162-L of the source/drain contact 161/162 is surrounded by the source/drain feature 151/152 formed as thin layers.

In some embodiments, structure as shown in FIG. 12A and FIG. 12B provides several advantages similar to that of previously described embodiment. For example, the source/drain contacts 161 and 162 extending downwards to a position under the top surface of the semiconductor fin 104 facilitate the current flowing through a channel region between the source/drain features 151 and 152. Also, it would be easier and faster for electric current to pass through the source/drain contacts 161 and 162 and thin layers of the source/drain features 151 and 152, thereby decreasing the contact resistance.

It should be noted that the details of the structures of the embodiments are provided for exemplification, and the described details of the embodiments are not intended to limit the present disclosure. It should be noted that not all embodiments of the invention are shown. Modifications and variations can be made without departing from the spirit of the disclosure to meet the requirements of the practical applications. Thus, there may be other embodiments of the present disclosure which are not specifically illustrated. Furthermore, the accompanying drawings are simplified for clear illustrations of the embodiment. Sizes and proportions in the drawings may not be directly proportional to actual products. Thus, the specification and the drawings are to be regard as an illustrative sense rather than a restrictive sense.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor fin over a substrate;
a gate structure along sidewalls and a top surface of the semiconductor fin, wherein the gate structure covers a first portion of the semiconductor fin;
a source/drain feature adjacent to the gate structure; and
a source/drain contact connected to the source/drain feature, wherein the source/drain contact extends downwards to a position that is lower than a top surface of the first portion of the semiconductor fin,
wherein the source/drain feature extends on a bottom and sides of the source/drain contact,
wherein the source/drain contact has an upper portion and a lower portion wider than the upper portion.

2. The semiconductor device as claimed in claim 1, wherein a portion of the source/drain contact that is lower than the top surface of the first portion of the semiconductor fin is disposed within the source/drain feature.

3. The semiconductor device as claimed in claim 1, wherein the source/drain feature has a concave cross-sectional shape.

4. The semiconductor device as claimed in claim 1, wherein an uppermost surface of the source/drain feature is level with the top surface of the first portion of the semiconductor fin.

5. The semiconductor device as claimed in claim 1, wherein a thickness of the source/drain feature is in a range from 1 nm to 10 nm.

6. The semiconductor device as claimed in claim 1, wherein the source/drain feature is a doped region having a doping concentration of $10^{19}$ cm$^{-3}$ and about $10^{21}$ cm$^{-3}$.

7. The semiconductor device as claimed in claim 1, wherein a distance between a lowermost bottom of the source/drain contact and a bottom surface of the semiconductor fin is equal to or less than 10 nm.

8. The semiconductor device as claimed in claim 1, wherein the lower portion is directly on a concave upper surface of the source/drain feature and the upper portion is electrically connected to the lower portion.

9. The semiconductor device as claimed in claim 1, wherein the semiconductor fin comprises nanowires or nanosheets.

10. The semiconductor device as claimed in claim 1, wherein the source/drain feature has a uniform thickness.

11. The semiconductor device as claimed in claim 1, wherein the source/drain feature extends to a second vertical position level with the top surface of the first portion of the semiconductor fin.

* * * * *